United States Patent
Joo et al.

(10) Patent No.: US 12,349,505 B2
(45) Date of Patent: Jul. 1, 2025

(54) METHOD OF MANUFACTURING ELECTRIC DEVICE

(71) Applicant: ELECTRONICS AND TELECOMMUNICATIONS RESEARCH INSTITUTE, Daejeon (KR)

(72) Inventors: Jiho Joo, Daejeon (KR); Yong Sung Eom, Daejeon (KR); Kwang-Seong Choi, Daejeon (KR); Chanmi Lee, Daejeon (KR); Gwang-Mun Choi, Daejeon (KR); Ki Seok Jang, Daejeon (KR); Seok-Hwan Moon, Daejeon (KR); Ho-Gyeong Yun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 579 days.

(21) Appl. No.: 17/828,701

(22) Filed: May 31, 2022

(65) Prior Publication Data

US 2022/0384674 A1   Dec. 1, 2022

(30) Foreign Application Priority Data

Jun. 1, 2021 (KR) .................. 10-2021-0071012
May 4, 2022 (KR) .................. 10-2022-0055657

(51) Int. Cl.
 *H10H 20/01* (2025.01)
 *H01L 23/00* (2006.01)

(52) U.S. Cl.
 CPC ............. *H10H 20/01* (2025.01); *H01L 24/83* (2013.01); *H01L 24/98* (2013.01); *H01L 2224/83224* (2013.01); *H01L 2224/8388* (2013.01)

(58) Field of Classification Search
 CPC ... H01L 2224/83224; H01L 2224/8388; H01L 24/08; H01L 24/98; H01L 25/0753;
 (Continued)

(56) References Cited

U.S. PATENT DOCUMENTS 10,497,584 B2   12/2019   Liao
11,289,622 B2    3/2022   Lee et al.
(Continued)

FOREIGN PATENT DOCUMENTS

JP   2003-133708 A    5/2003
JP   2003-332184 A   11/2003
(Continued)

OTHER PUBLICATIONS

Sungbum Cho et al., "Controlled adhesion force of a bendable elastomeric stamp for transferring micro semiconductor plates", The Korean Society of Mechanical Engineers, Nov. 2017, pp. 2853-2854.

*Primary Examiner* — Sonya M Sengupta

(57) ABSTRACT

Provided is a method for manufacturing an electronic device. The method for manufacturing the electronic device includes mapping good elements and defective elements on a substrate, providing a first transparent structure including a first adhesive layer on the substrate, selectively providing first laser light to the defective elements to cure the first adhesive layer on the defective elements and separate the defective elements from the substrate, providing a second transparent structure including a second adhesive layer, which adheres to new elements replaced for the defective elements, on the substrate, and selectively providing second laser light to the new elements to bond the new elements to the substrate.

20 Claims, 18 Drawing Sheets

(58) Field of Classification Search
CPC .. H01L 25/167; H10H 20/01; H10H 20/0364; H10H 20/85
See application file for complete search history.

(56) References Cited

U.S. PATENT DOCUMENTS

| | | |
|---|---|---|
| 2019/0021123 A1 | 1/2019 | Ma et al. |
| 2020/0075535 A1 | 3/2020 | Choi et al. |
| 2020/0235076 A1* | 7/2020 | Batres .................... H10H 20/01 |
| 2020/0243712 A1 | 7/2020 | Fukaya et al. |
| 2021/0265327 A1 | 8/2021 | Koo et al. |
| 2022/0076983 A1 | 3/2022 | Marinov et al. |
| 2022/0384674 A1* | 12/2022 | Joo ......................... H01L 24/98 |

FOREIGN PATENT DOCUMENTS

| | | |
|---|---|---|
| KR | 20180105803 A | 10/2018 |
| KR | 10-2019-0129872 A | 11/2019 |
| KR | 20200007498 A | 1/2020 |
| KR | 20200012356 A | 2/2020 |
| KR | 10-2020-0079481 A | 7/2020 |
| KR | 10-2020-0111828 A | 9/2020 |
| KR | 20200114077 A | 10/2020 |
| KR | 10-2177446 B1 | 11/2020 |
| KR | 10-2021-0019373 A | 2/2021 |

* cited by examiner

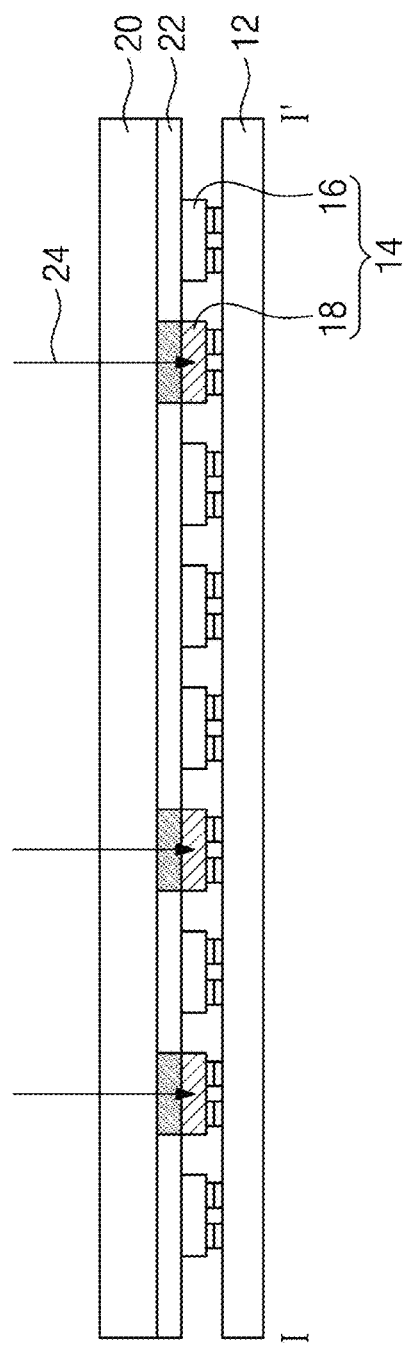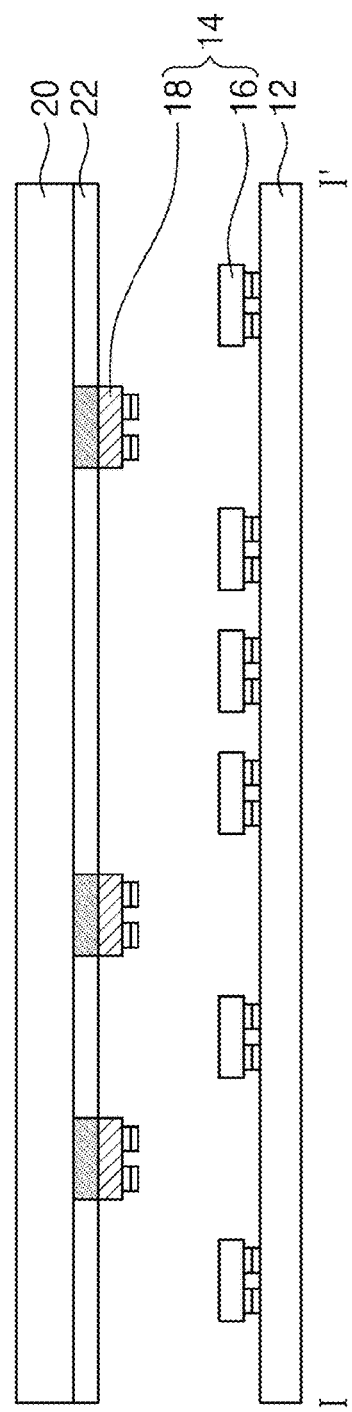

METHOD OF MANUFACTURING ELECTRIC DEVICE

CROSS-REFERENCE TO RELATED APPLICATIONS

This U.S. non-provisional patent application claims priority under 35 U.S.C. § 119 of Korean Patent Application Nos. 10-2001-0071012, filed on Jun. 1, 2021, and 10-2022-0055657, filed on May 4, 2022, the entire contents of which are hereby incorporated by reference.

BACKGROUND

The present disclosure herein relates to a method for manufacturing an electronic device, and more particularly, to a method for manufacturing an electronic device, which is capable of improving productivity.

Recently, with the development of information technology, various types of electronic devices have been developed. The electronic device may include silicon/compound elements, MEMS/sensors, RF/analog elements, power semiconductor elements, and LED/display elements. A general method of manufacturing an electronic device may include a vacuum adsorption process. However, the vacuum adsorption process may have a disadvantage of increasing in thermal stress due to a difference in thermal expansion coefficient between a lower element and an upper element.

SUMMARY

The present disclosure provides a method for manufacturing an electronic device, which is capable of improving productivity.

The object of the present disclosure is not limited to the aforesaid, but other objects not described herein will be clearly understood by those skilled in the art from descriptions below.

An embodiment of the inventive concept provides a method for manufacturing an electronic device. The method for manufacturing an electronic device includes: mapping good elements and defective elements on a substrate; providing a first transparent structure comprising a first adhesive layer on the substrate; selectively providing first laser light to the defective elements to cure the first adhesive layer on the defective elements and separate the defective elements from the substrate; providing a second transparent structure including a second adhesive layer, which adheres to new elements replaced for the defective elements, on the substrate; and selectively providing second laser light to the new elements to bond the new elements to the substrate.

In an embodiment, the first laser light may include ultraviolet light, and the second laser light may include infrared light.

In an embodiment, the first adhesive layer may include an ultraviolet curable adhesive, and the second adhesive layer may include a thermoplastic resin.

In an embodiment, the first adhesive layer may include a thermosetting resin, and the second adhesive layer may include a thermoplastic resin.

In an embodiment, the first adhesive layer may include: a first lower adhesive layer on the first transparent structure; and a first upper adhesive layer on the first lower adhesive layer.

In an embodiment, the first lower adhesive layer may include a thermosetting resin, and the first upper adhesive layer may include a photo-curable resin.

In an embodiment, the first transparent structure may include a first heater layer that heats the first lower adhesive layer.

In an embodiment, the second adhesive layer may include: a second lower adhesive layer on the second transparent structure; and a second upper adhesive layer on the second lower adhesive layer.

In an embodiment, the second lower adhesive layer may include a thermoplastic resin, and the second upper adhesive layer may include a photo plastic resin.

In an embodiment, the second transparent structure may include a second heater layer that heats the second lower adhesive layer.

In an embodiment of the inventive concept, a method for manufacturing an electronic device includes: mapping good elements and defective elements on a substrate; providing a first transparent structure including a first adhesive layer on the substrate; allowing the first adhesive layer to be in contact with the good elements and the defective elements; selectively providing ultraviolet light to the defective elements to fix the defective elements to the first transparent structure by the first adhesive layer and separate the defective elements from the substrate; providing a second transparent structure including a second adhesive layer, which adheres to new elements replaced for the defective elements, on the substrate; and allowing the new elements to be in contact with the substrate; and selectively providing ultraviolet light or infrared light to the new elements to bond the new elements to the substrate.

In an embodiment, the first adhesive layer may include an ultraviolet curable adhesive, and the second adhesive layer may include a thermoplastic resin.

In an embodiment, the first adhesive layer may include: a first lower adhesive layer on the first transparent structure; and a first upper adhesive layer on the first lower adhesive layer.

In an embodiment, the first lower adhesive layer may include a thermosetting resin, and the first upper adhesive layer may include a photo-curable resin.

In an embodiment, the first transparent structure may include a first heater layer that heats the first lower adhesive layer.

In an embodiment, the second adhesive layer may include: a second lower adhesive layer on the second transparent structure; and a second upper adhesive layer on the second lower adhesive layer.

In an embodiment, the second lower adhesive layer may include a thermoplastic resin, and the second upper adhesive layer may include a photo plastic resin.

In an embodiment, the second transparent structure may include a second heater layer that heats the second lower adhesive layer.

In an embodiment, each of the first and second transparent structures may include glass, sapphire, acrylic, polyimide, epoxy, or quartz.

In an embodiment, each of the good elements and the defective elements may include a light emitting diode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 3 to 9 are process cross-sectional views taken along line I-I' of FIG. 2;

DETAILED DESCRIPTION

Figure 1:
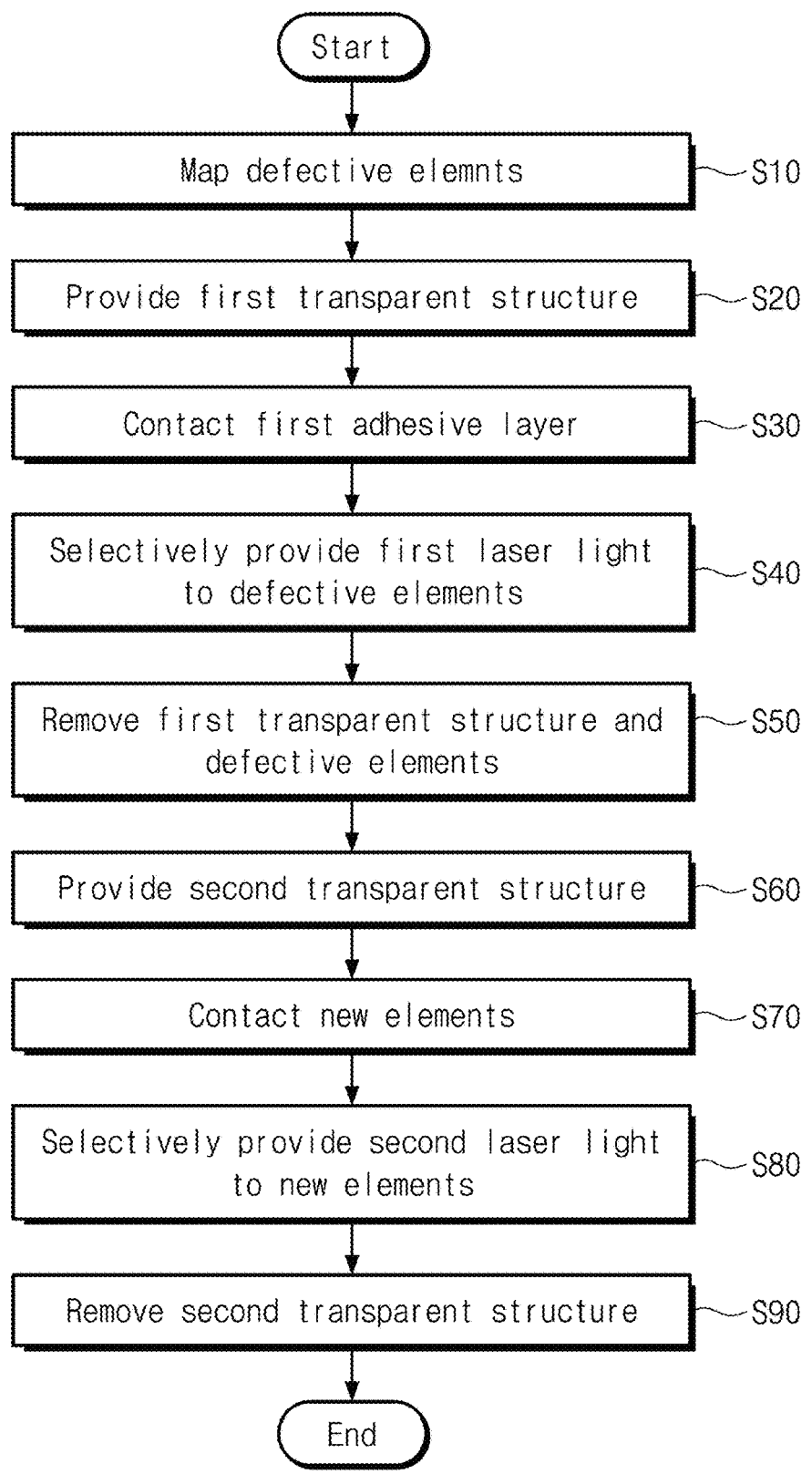
FIG. 1 is a flowchart illustrating a method for manufacturing an electronic device according to the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Bonding, adhesion, and laser may be techniques widely disclosed in the fields of semiconductors. Thus, regions illustrated in the figures have schematic properties, and shapes of the regions illustrated in the figures exemplify specific forms of the regions of elements and are not intended to limit the scope of the invention.

Figure 2:
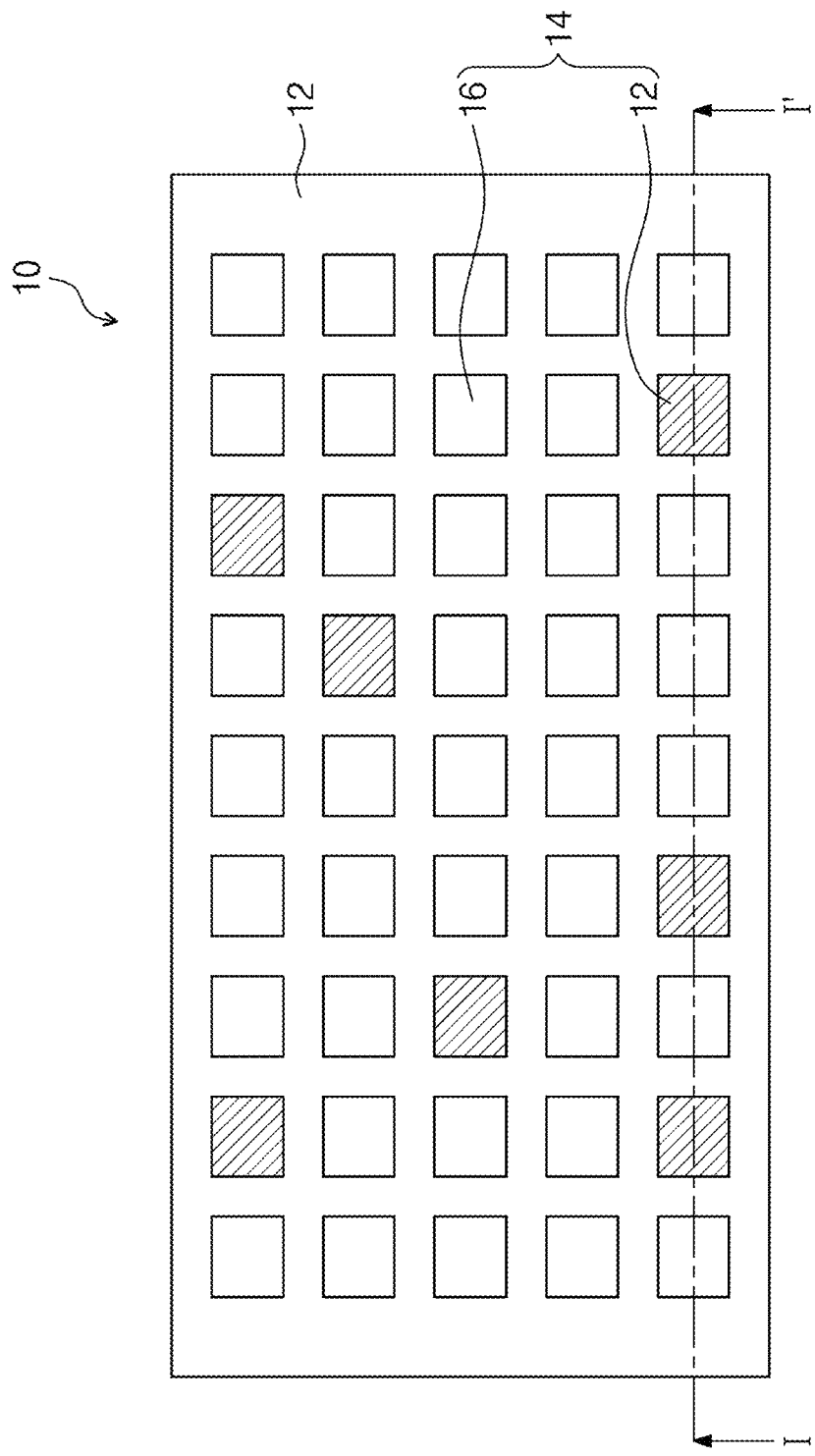
FIG. 2 is a plan view illustrating an example of the electronic device according to the inventive concept.

FIG. 1 is a flowchart illustrating a method for manufacturing an electronic device according to the inventive concept. FIG. 2 is a view illustrating an example of the electronic device 10 according to the inventive concept. FIGS. 3 to 9 are process cross-sectional views taken along line I-I' of FIG. 2.

Referring to FIGS. 1 and 2, the electronic device 10 is inspected to map defective elements 18 (S10). The electronic device 10 may include a display device, a light emitting device, or a light source device. The electronic device 10 may be inspected by a test device. The test device may determine good elements 16 and the defective elements 18 of light source elements 14. Each of the good elements 16 and the defective elements 18 may include a light emitting element such as an organic light emitting diode or an inorganic light emitting diode. The test device may determine positions of the good elements 16 and the defective elements 18 on a substrate 12 to display their positions on the display device.

Figure 3:
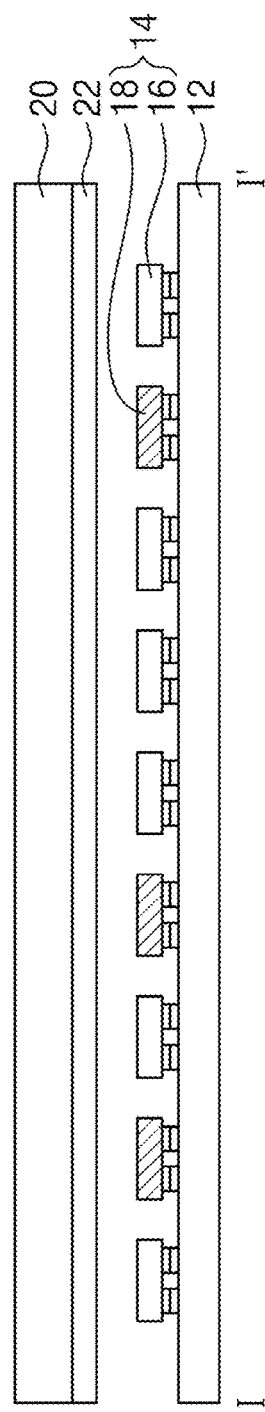

Referring to FIGS. 1 and 3, a first transparent structure 20 is provided on the substrate 12 (S20). According to an embodiment, the first transparent structure 20 may include a transparent flat plate. For example, the first transparent structure 20 may include glass, sapphire, acrylic, polyimide, epoxy, or quartz, but an embodiment of the inventive concept is not limited thereto. The first transparent structure 20 may have a transmittance of about 50% to about 99%. According to an embodiment, the first transparent structure 20 may have a first adhesive layer 22. The first adhesive layer 22 may be formed on the first transparent structure 20 through methods such as screen printing, laminating, spin coating, and photolithography. The first adhesive layer 22 may be transparent. Also, the first adhesive layer 22 may be translucent. According to an embodiment, the first adhesive layer 22 may include an ultraviolet curable adhesive. The first adhesive layer 22 may further include an absorbing material such as carbon or dye, but an embodiment of the inventive concept is not limited thereto. Alternatively, the first adhesive layer 22 may include a thermosetting resin or a thermo-curable polymer resin. The thermosetting polymer resin may include polyacrylate. The thermosetting polymer resin may include a reducing agent, a curing agent, and a polymer resin. The thermosetting polymer resin may further include an organic material including an amine group, a carboxyl group, and siloxane bond. The organic material including the siloxane bond may include polydimethylsiloxane (PDMS) or polymerized siloxane. The polydimethylsiloxane has a chemical formula: $CH_3[Si[CH_3]_2O]nSi(CH_3)_3$.

Figure 4:
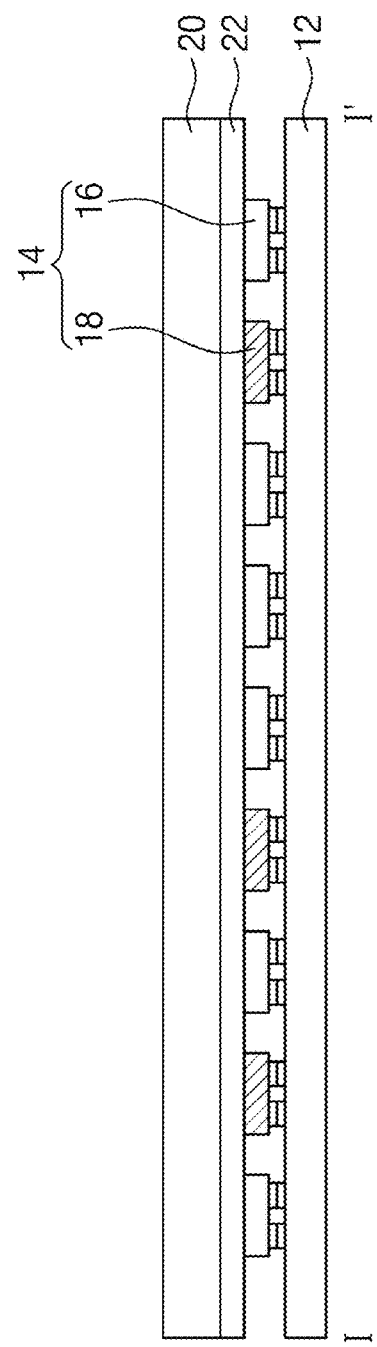

Referring to FIGS. 1 and 4, the first adhesive layer 22 is in contact with the light source elements 14 (S30). The first adhesive layer 22 may allow the good elements 16 and the defective elements 18 to adhere to and/or be in contact with each other.

Referring to FIGS. 1 and 5, first laser light 24 is selectively provided to the defective elements 18 (S40). The first laser light 24 may be provided from a VCSEL array, or a DFB laser diode array. Alternatively, the first laser light 24 may be provided by a scanning laser light source, but an embodiment of the inventive concept is not limited thereto.

The first laser light 24 may pass through the first transparent structure 20 and the first adhesive layer 22. For example, the first laser light 24 may include ultraviolet light having a wavelength of about 10 nm to about 400 nm. When the first adhesive layer 22 includes an ultraviolet curable adhesive, the first laser light 24 may cure the first adhesive layer 22. Alternatively, the first laser light 24 may include visible light or infrared light. The visible light may have a wavelength between about 400 nm and about 750 nm. The infrared light may have a wavelength of about 750 nm to about 1000 µm. When the first adhesive layer 22 includes the thermosetting resin, the first laser light 24 may cure the first adhesive layer 22. The first adhesive layer 22 may fix the defective elements 18 to the first transparent structure 20.

The first laser light 24 may be selectively provided to the defective elements 18. The first laser light 24 may heat the defective elements 18 to separate the defective elements 18 from a substrate 12. The first laser light 24 may be provided to the new element 19 in a scanning manner, a beam forming manner, or an optical phased array (OPA) manner.

Figure 10:
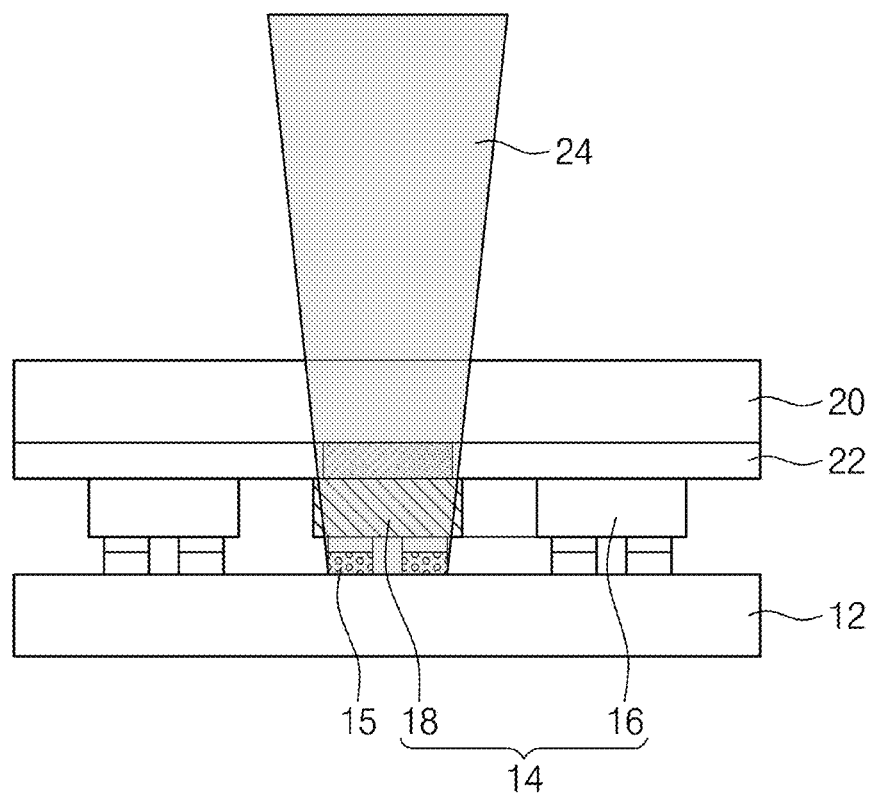
FIG. 10 is a cross-sectional view illustrating an example of a first adhesive layer of FIG. 5.

FIG. 10 is a cross-sectional view illustrating an example of the first adhesive layer of FIG. 5.

Referring to FIG. 10, the first adhesive layer 22 may be formed on an entire top surface of the first transparent structure 20. The first adhesive layer 22 may adhere to the defective element 18 and the good element 16. The first laser light 24 may pass through the first transparent structure 20 and the first adhesive layer 22. The first laser light 24 may be selectively provided to the defective element 18. A portion of the first adhesive layer 22 on the defective element 18 may be cured. The defective element 18 may be heated by the first laser light 24. The defective element 18 may have solders 15 and an underfill. The solders 15 of the defective element 18 may be melted and then separated from the substrate 12.

Figure 11:
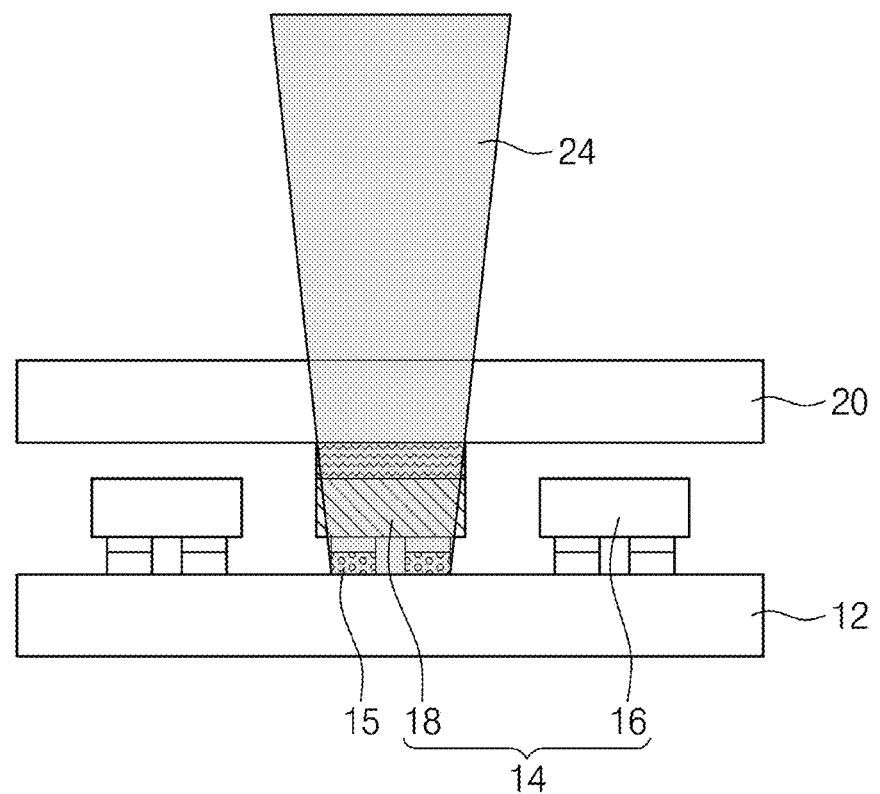
FIG. 11 is a cross-sectional view illustrating an example of the first adhesive layer of FIG. 5.

FIG. 11 is a cross-sectional view illustrating an example of the first adhesive layer of FIG. 5.

Referring to FIG. 11, the first adhesive layer 22 may be selectively disposed on the defective elements 18. The first adhesive layer 22 may be partially provided on the first transparent structure 20 by a printing method, a patterning method, or an applying method. The first adhesive layer 22 may be provided between the defective element 18 and the first transparent structure 20.

Although not shown, the first laser light 24 may be provided on the entire surface of the first transparent structure 20. A light source of the first laser light 24 may be a surface light source.

Figure 12:
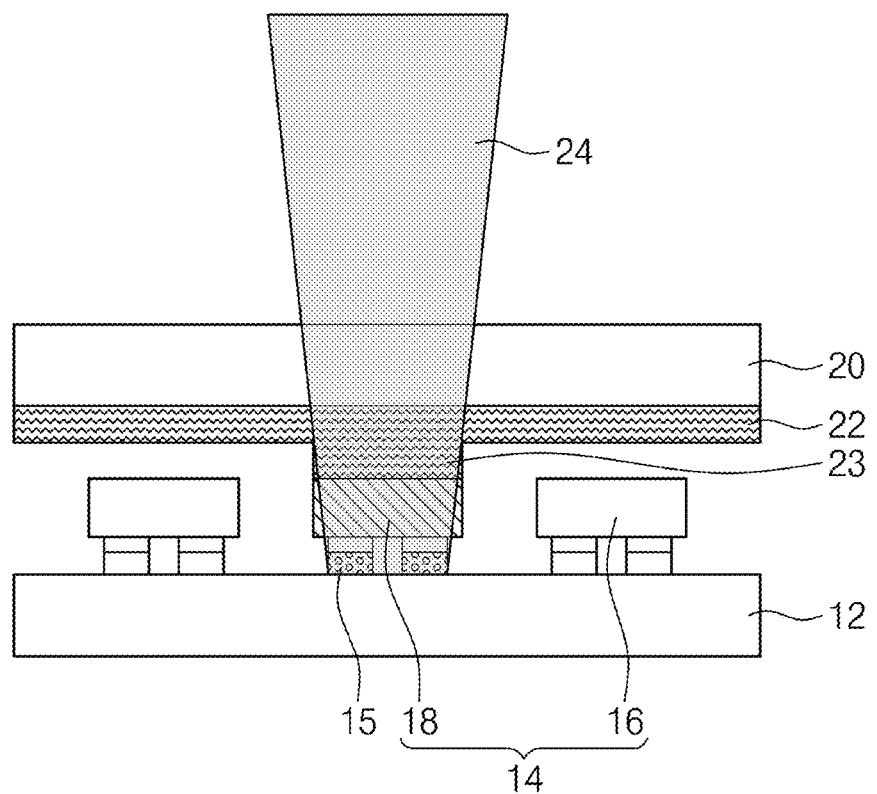
FIG. 12 is a cross-sectional view illustrating an example of the first adhesive layer of FIG. 5.

FIG. 12 is a cross-sectional view illustrating an example of the first adhesive layer of FIG. 5.

Referring to FIG. 12, the first adhesive layer 22 may have a first adhesive protrusion 23. The first adhesive protrusion 23 may be disposed on the first adhesive layer 22. The first adhesive protrusion 23 may be in selective contact with the defective element 18. The first adhesive layer 22 may be separated from the good elements 16.

Figure 13:
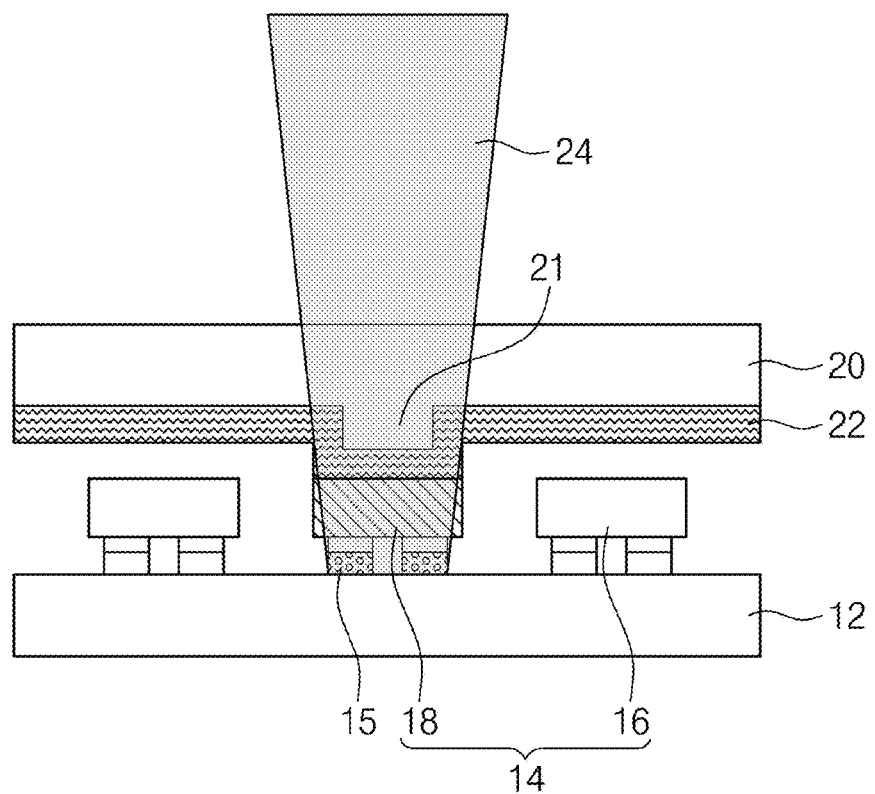
FIG. 13 is a cross-sectional view illustrating examples of a first transparent structure and a first adhesive layer of FIG. 5.

FIG. 13 is a cross-sectional view illustrating examples of the first transparent structure and the first adhesive layer of FIG. 5.

Referring to FIG. 13, the first transparent structure 20 may have a first transparent protrusion 21. The first transparent protrusion 21 may be selectively provided on the defective element 18. The first adhesive layer 22 may be conformally disposed on the first transparent structure 20 and the first transparent protrusion 21. The first adhesive layer 22 on the first transparent protrusion 21 may selectively adhere to and/or be in contact with the defective element 18.

Figure 14:
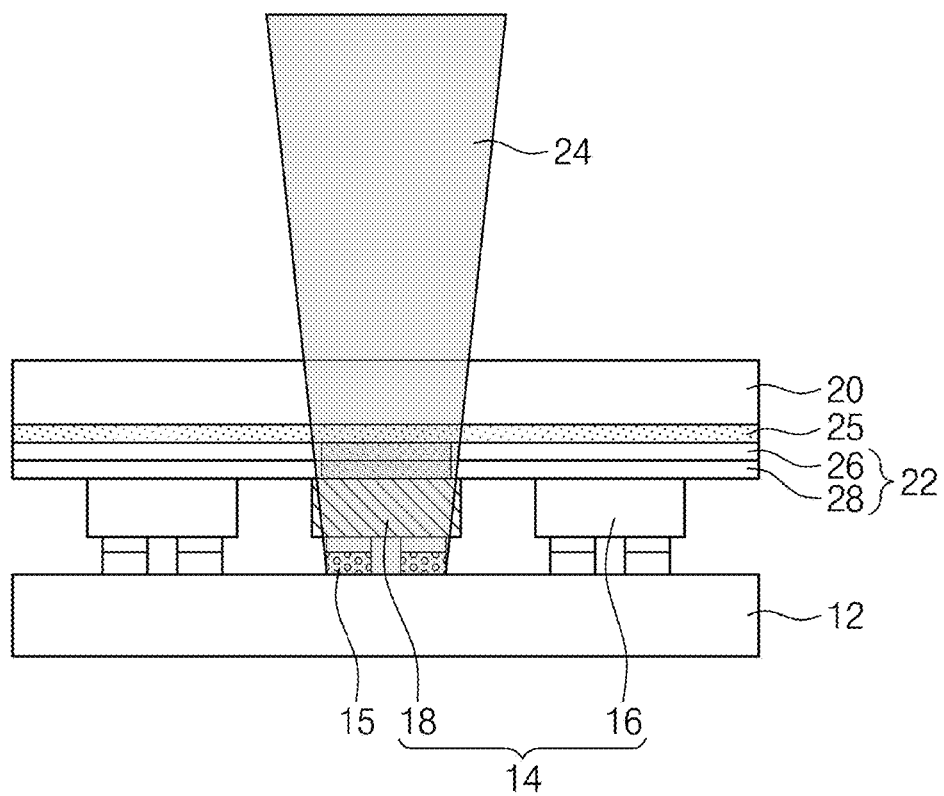
FIG. 14 is a cross-sectional view illustrating an example of the first adhesive layer of FIG. 5.

FIG. 14 is a cross-sectional view illustrating an example of the first adhesive layer of FIG. 5.

Referring to FIG. 14, the first transparent structure 20 may have a first heater layer 25, and the first adhesive layer 22 may include a first lower adhesive layer 26 and a first upper adhesive layer 28.

The first heater layer 25 may be provided between the first transparent structure 20 and the first lower adhesive layer 26. The first heater layer 25 may heat the first lower adhesive layer 26 of the first adhesive layer 22. The first heater layer 25 may transmit the first laser light 24.

The first lower adhesive layer 26 may be provided between the first heater layer 25 and the first upper adhesive layer 28. The first lower adhesive layer 26 may be cured by being heated by the first heater layer 25. The first lower adhesive layer 26 may include a thermosetting resin. The first lower adhesive layer 26 may transmit the first laser light 24.

The first upper adhesive layer 28 may be provided on the first lower adhesive layer 26. The first upper adhesive layer 28 may be cured by absorbing a portion of the first laser light 24. The first upper adhesive layer 28 may include an ultraviolet curable adhesive. The first upper adhesive layer 28 may transmit a portion of the first laser light 24.

Referring back to FIGS. 1 and 6, the first transparent structure 20, the first adhesive layer 22, and the defective elements 18 are removed (S50). The defective elements 18 may be fixed to the first transparent structure 20 by the first adhesive layer 22 and removed from the substrate 12. The good elements 16 may be separated from the first adhesive layer 22 to remain on the substrate 12. Although not shown, the first adhesive layer 22 and the defective elements 18 may be removed from the first transparent structure 20. The first transparent structure 20 may be cleaned by an organic solvent (e.g., alcohol or acetone).

Figure 7:
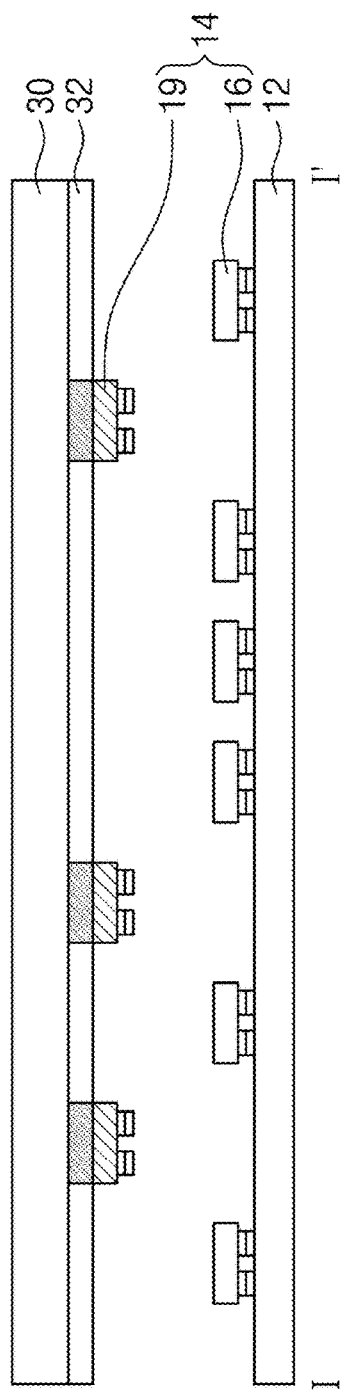

Referring to FIGS. 1 and 7, a second transparent structure 30 is provided on the substrate 12 (S60). The second transparent structure 30 may be the same as the first transparent structure 20. For example, the second transparent structure 30 may include glass, sapphire, acrylic, polyimide, epoxy, or quartz, but an embodiment of the inventive concept is not limited thereto. The second transparent structure 30 may have a transmittance of about 50% to about 99%. According to an embodiment, the second transparent structure 30 may have a second adhesive layer 32. The second adhesive layer 32 may be formed on the second transparent structure 30 through methods such as screen printing, laminating, spin coating, and photolithography. The second adhesive layer 32 may be different from the first adhesive layer 22. According to an embodiment, the second adhesive layer 32 may include a thermoplastic resin. The thermoplastic resin may include polyacrylate. Alternatively, the second adhesive layer 32 may include a thermosetting resin.

New elements 19 may be provided on the second adhesive layer 32. The new elements 19 may be replacement elements for the defective elements 18 of FIG. 2. The new elements 19 may be the same as the good elements 116.

Figure 8:
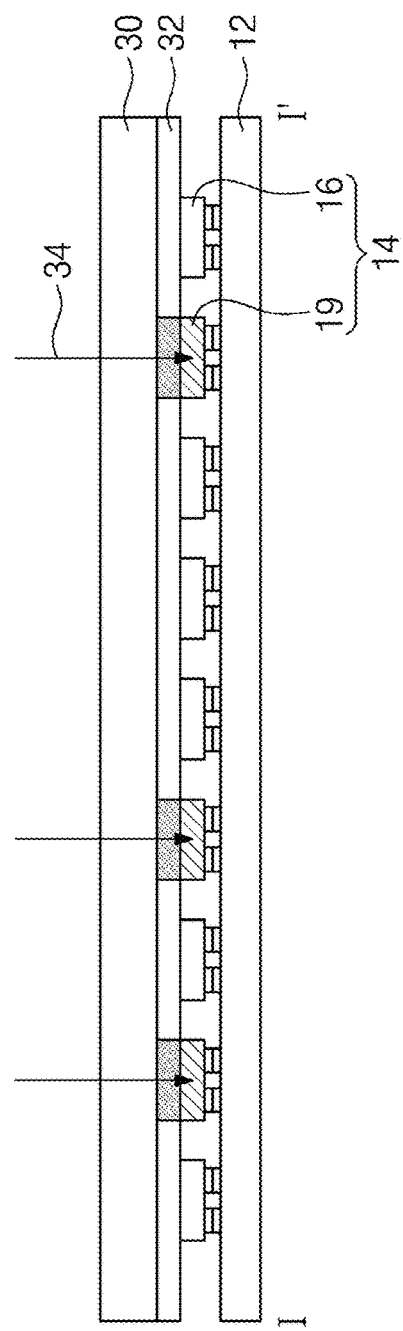
Figure 9:
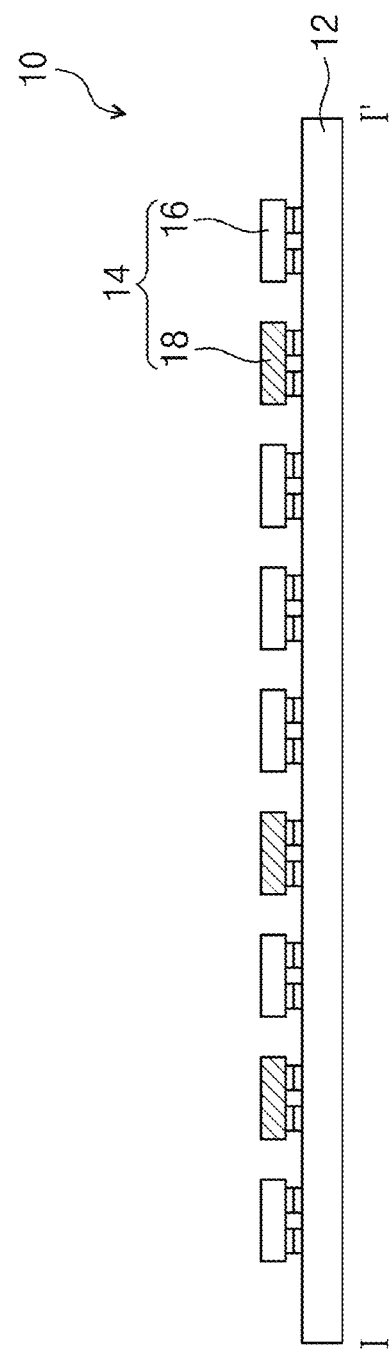

Referring to FIGS. 1 and 8, the new elements 19 are in contact with the substrate 12 (S70).

Continuously referring to FIGS. 1 and 8, the second laser light 34 is selectively provided to the new elements 19 (S80). The second laser light 34 may include visible light or infrared light. The second laser light 34 may be provided from a VCSEL array or a DFB laser diode array. Alternatively, the second laser light 34 may be provided by a scanning laser light source, but an embodiment of the inventive concept is not limited thereto.

The second laser light 34 may pass through the second adhesive layer 32 and the second transparent structure 30 so as to be absorbed by the new elements 19. Each of the new elements 19 may be heated by the second laser light 34 and then bonded to the substrate 12.

Figure 15:
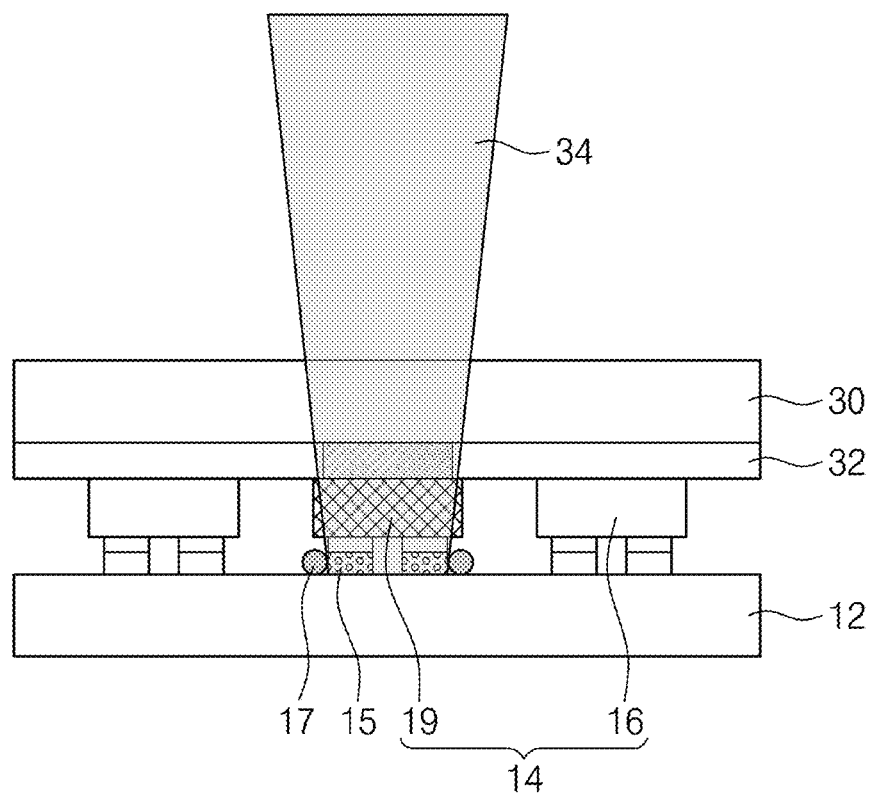
FIG. 15 is a cross-sectional view illustrating an example of a second adhesive layer of FIG. 8.

FIG. 15 is a cross-sectional view illustrating an example of the second adhesive layer 32 of FIG. 8.

Referring to FIG. 15, the second adhesive layer 32 may be disposed to be flat on an entire top or bottom surface of the substrate 12. The second adhesive layer 32 may be melted by heating the second adhesive layer 32. The second laser light 34 may pass through the second transparent structure 30 and the second adhesive layer 32. The second laser light 34 may heat the new element 19.

The new element 19 may have solders 15 and a polymer material 17. The solders 15 and polymer material 17 may be provided between new element 19 and substrate 12. The solders 15 and the polymer material 17 may be melted by the second laser light 34 to bond the new element 19 to the substrate 12. The solders 15 and the polymer material 17 may be contained at a ratio of about 8:2. The solders 15 may include solder powder. The solder powder may be a low melting point solder. The low melting point solder may include Sn, Bi, In, Ag, Pb, and/or Cu. For example, the low melting point solder may include 60Sn/40Bi, 52In/48Sn, 97In/3Ag, 57Bi/42Sn/1Ag, 58Bi/42Sn, 52Bi/32Pb/16Sn, 96.5Sn/3Ag/0.5Cu, 96.5Sn/3.5Ag, or Sn. The polymer material 17 may surround the periphery of the solders 15 when the solders 15 are melted. The polymer materials 17 may include resin, but an embodiment of the inventive concept is not limited thereto.

The second laser light 34 may be selectively provided to the new element 19. The second laser light 34 may be provided to the new element 19 in a scanning manner, a beam forming manner, or an optical phased array (OPA) manner.

Figure 16:
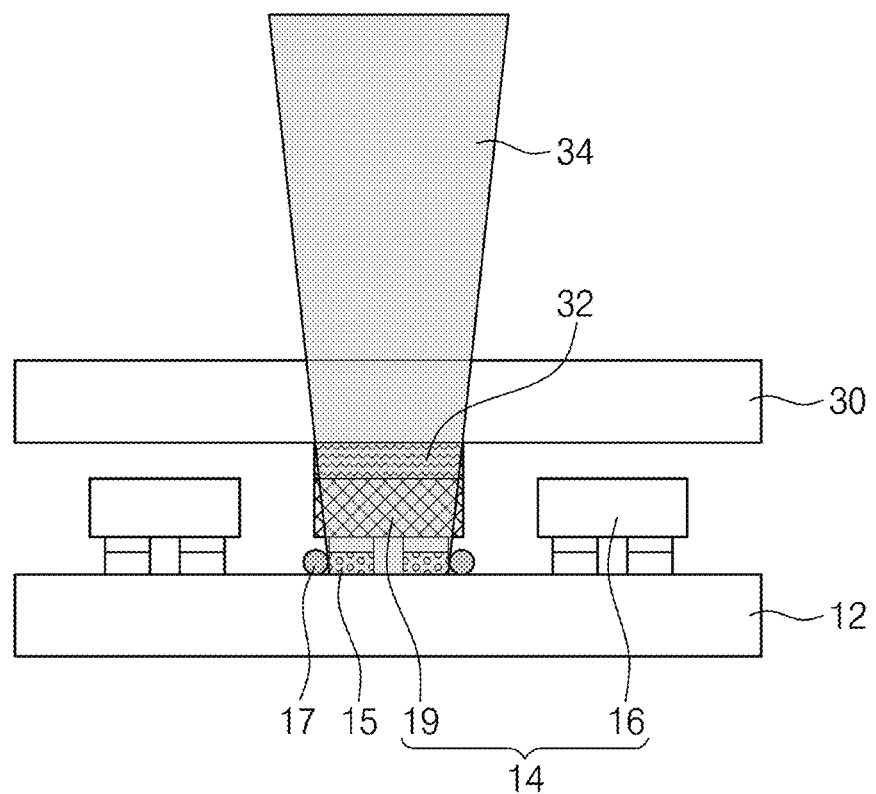
FIG. 16 is a cross-sectional view illustrating an example of the second adhesive layer of FIG. 8.

FIG. 16 is a cross-sectional view illustrating an example of the second adhesive layer 32 of FIG. 8.

Referring to FIG. 16, the second adhesive layer 32 may be selectively provided on the new element 19. The second adhesive layer 32 may be removed between the good elements 16 and the second transparent structure 30.

Figure 17:
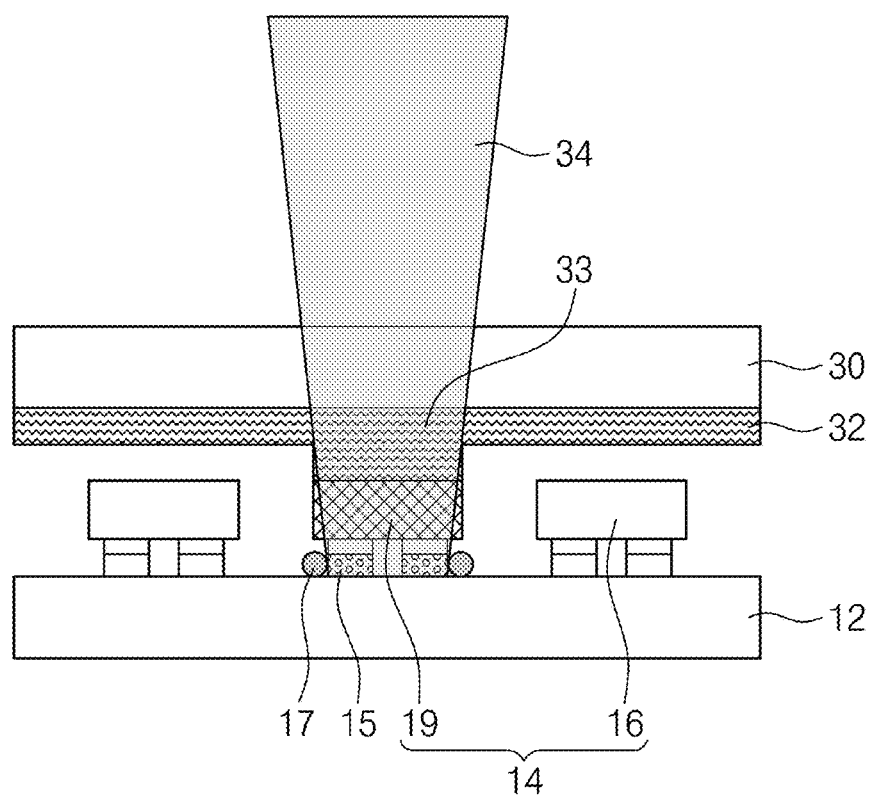
FIG. 17 is a cross-sectional view illustrating an example of the second adhesive layer of FIG. 8.

FIG. 17 is a cross-sectional view illustrating an example of the second adhesive layer 32 of FIG. 8.

Referring to FIG. 17, the second adhesive layer 32 may have a second adhesive protrusion 33. The second adhesive protrusion 33 may be provided on the second adhesive layer 32. The second adhesive protrusion 33 may be selectively provided between the new element 19 and the second adhesive layer 32. The second adhesive protrusion 33 may allow the new element 19 to adhere onto the second adhesive layer 32. When the new element 19 is in contact with the substrate 12, the second adhesive layer 32 and the good element 16 may be separated from each other.

Figure 18:
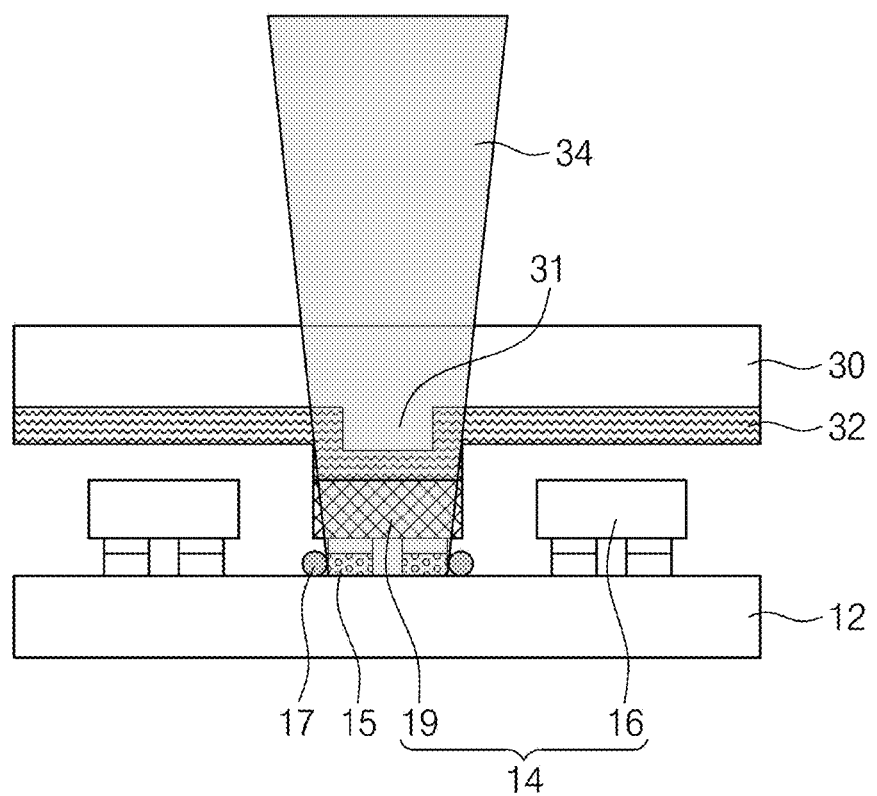
FIG. 18 is a cross-sectional view illustrating examples of a second transparent structure and the second adhesive layer of FIG. 8.

FIG. 18 is a cross-sectional view illustrating examples of the second transparent structure 30 and the second adhesive layer 32 of FIG. 8.

Referring to FIG. 18, the second transparent structure 30 may have a second transparent protrusion 31. The second transparent protrusion 31 may be selectively provided on the defective element 18. The second adhesive layer 32 may be conformally provided on the second transparent structure 30 and the second transparent protrusion 31. The second adhesive layer 32 on the second transparent protrusion 31 may selectively adhere to and/or be in contact with the new element 19.

Figure 19:
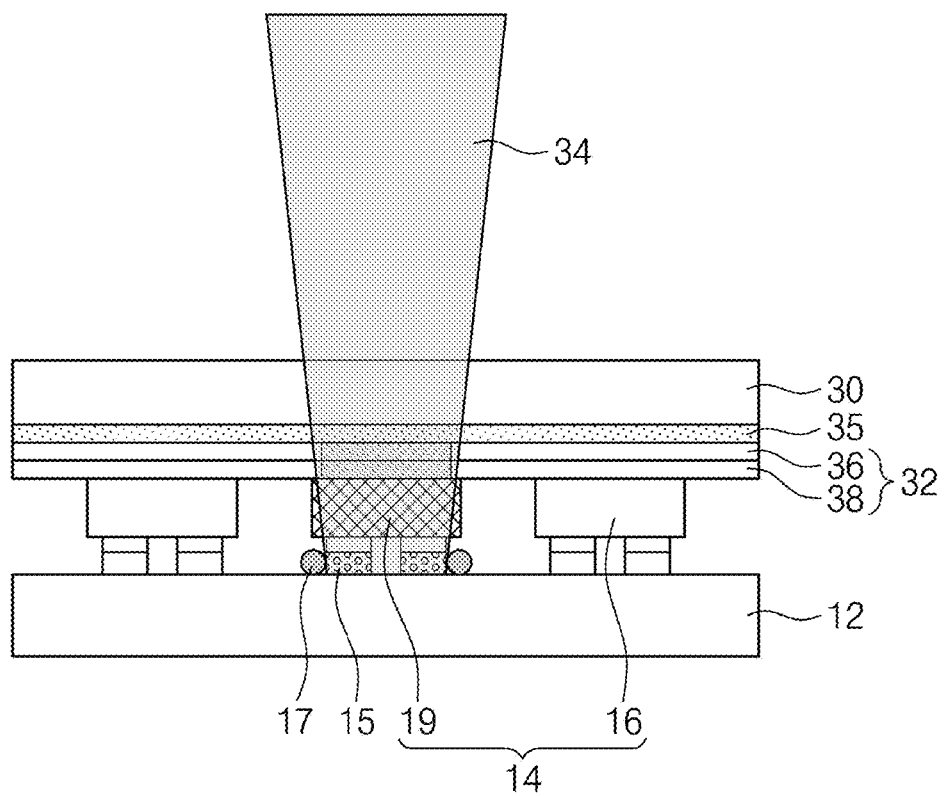
FIG. 19 is a cross-sectional view illustrating examples of the second transparent structure and the second adhesive layer of FIG. 8.

FIG. 19 is a cross-sectional view illustrating examples of the second transparent structure and the second adhesive layer of FIG. 8.

Referring to FIG. 19, the second transparent structure 30 may have a second heater layer 35, and the second adhesive layer 32 may include a second lower adhesive layer 36 and a second upper adhesive layer 38.

The second heater layer 35 may be provided between the second transparent structure 30 and the second lower adhesive layer 36. The second heater layer 35 may be melted by heating the second lower adhesive layer 36. The second heater layer 35 may transmit the second laser light 34.

The second lower adhesive layer 36 may be provided between the second heater layer 35 and the second upper adhesive layer 38. The second lower adhesive layer 36 may be heated by the second heater layer 35. The first lower adhesive layer 26 may include a thermoplastic adhesive. The second lower adhesive layer 36 may transmit the second laser light 34.

The second upper adhesive layer 38 may be provided on the second lower adhesive layer 36. The second upper adhesive layer 38 may absorb a portion of the second laser light 34 and then be melted. The second upper adhesive layer 38 may include an optical plastic adhesive. For example, the second upper adhesive layer 38 may transmit another portion of the second laser light 34.

Referring again to FIGS. 1 and 9, the second transparent structure 30 and the second adhesive layer 32 are removed (S90). The second transparent structure 30 and the second adhesive layer 32 may be separated from the new element 19 on the substrate 12. The light source elements 14 of the electronic device 10 may include the good elements 16 and the new elements 19. A rework process of the defective element 18 may be completed.

Figure 20:
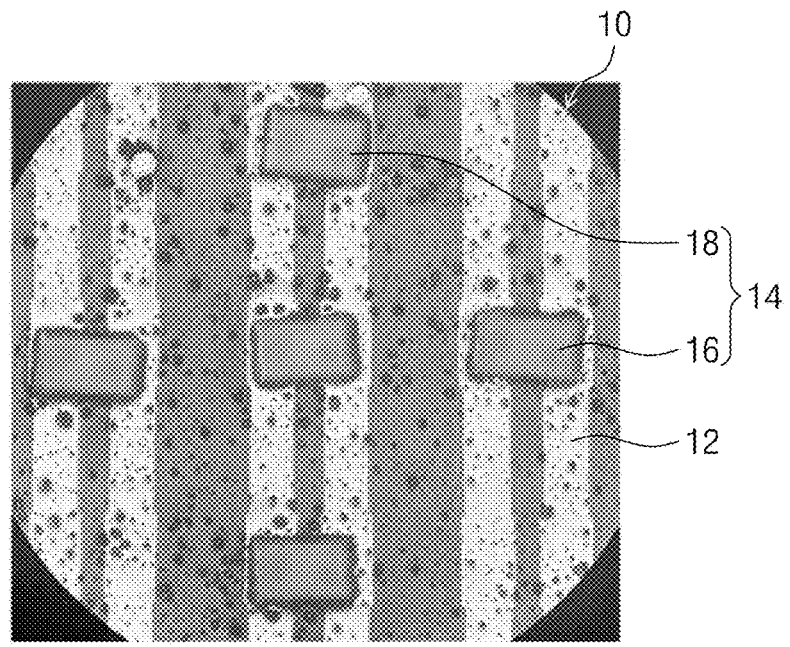
FIGS. 20 to 22 are plan views illustrating a method for manufacturing an electronic device according to the inventive concept.
Figure 21:
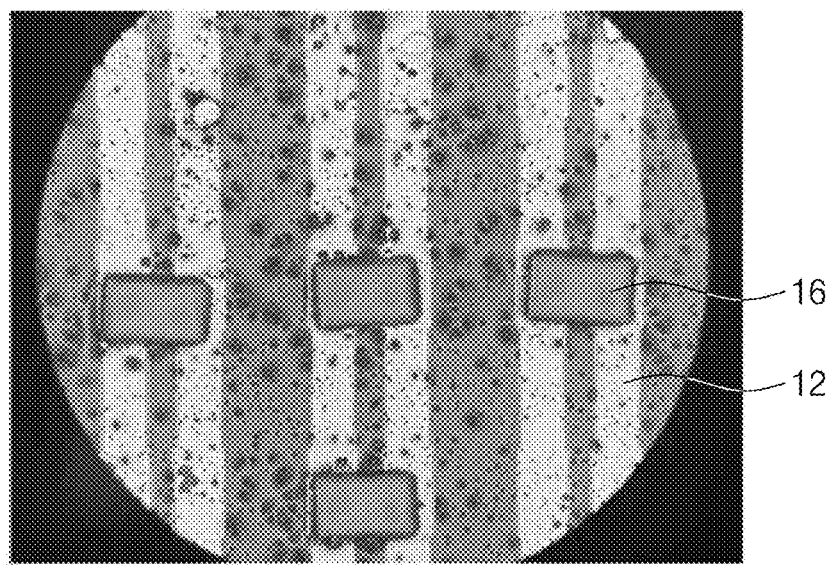
Figure 22:
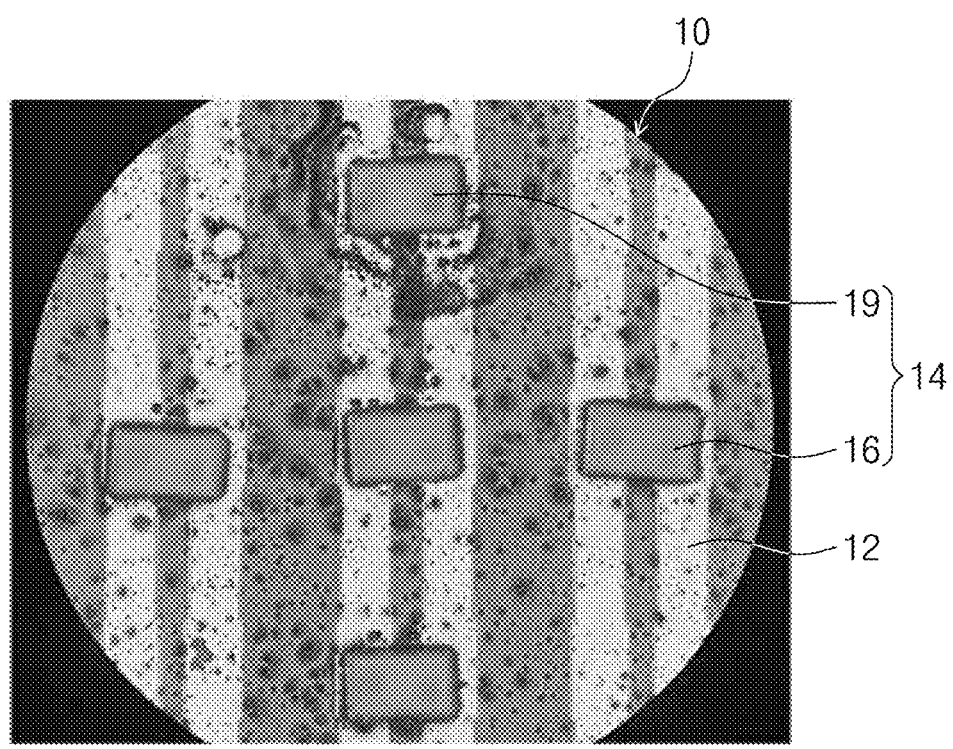

FIGS. 20 to 22 are plan views illustrating a method for manufacturing an electronic device 10 according to the inventive concept.

Referring to FIG. 20, the electronic device 10 may include light source elements 14 including good elements 16 and defective elements 18 on a substrate 12.

Referring to FIG. 21, the defective element 18 may be removed.

Referring to FIG. 22, new element 19 may be bonded to the substrate 12 by replacing the defective element 18.

Therefore, in the method for manufacturing the electronic device 10 according to an embodiment of the inventive concept, the plurality of defective elements 18 may be collectively replaced with the new elements 19 by using a first adhesive layer 22 and a second adhesive layer 32 to improve productivity.

The method of manufacturing the electronic device according to the inventive concept may improve the productivity by collectively replacing the plurality of defective elements with the new elements by using the first and second adhesive layers.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A method for manufacturing an electronic device, the method comprising:
   mapping good elements and defective elements on a substrate;
   providing a first transparent structure comprising a first adhesive layer on the substrate;

selectively providing first laser light to the defective elements to cure the first adhesive layer on the defective elements and separate the defective elements from the substrate;

providing a second transparent structure comprising a second adhesive layer, which adheres to new elements replaced for the defective elements, on the substrate; and selectively providing second laser light to the new elements to bond the new elements to the substrate.

2. A method for manufacturing an electronic device, the method comprising:

mapping good elements and defective elements on a substrate;

providing a first transparent structure comprising a first adhesive layer on the substrate;

selectively providing first laser light to the defective elements to cure the first adhesive layer on the defective elements and separate the defective elements from the substrate;

providing a second transparent structure comprising a second adhesive layer, which adheres to new elements replaced for the defective elements, on the substrate; and selectively providing second laser light to the new elements to bond the new elements to the substrate, wherein the first laser light comprises ultraviolet light, and the second laser light comprises infrared light.

3. The method of claim 2, wherein the first adhesive layer comprises an ultraviolet curable adhesive, and the second adhesive layer comprises a thermoplastic resin.

4. The method of claim 1, wherein the first adhesive layer comprises a thermosetting resin, and the second adhesive layer comprises a thermoplastic resin.

5. The method of claim 1, wherein the first adhesive layer comprises:

a first lower adhesive layer on the first transparent structure; and a first upper adhesive layer on the first lower adhesive layer.

6. The method of claim 5, wherein the first lower adhesive layer comprises a thermosetting resin, and the first upper adhesive layer comprises a photo-curable resin.

7. The method of claim 5, wherein the first transparent structure comprises a first heater layer that heats the first lower adhesive layer.

8. The method of claim 1, wherein the second adhesive layer comprises:

a second lower adhesive layer on the second transparent structure; and a second upper adhesive layer on the second lower adhesive layer.

9. The method of claim 8, wherein the second lower adhesive layer comprises a thermoplastic resin, and the second upper adhesive layer comprises a photo plastic resin.

10. The method of claim 8, wherein the second transparent structure comprises a second heater layer that heats the second lower adhesive layer.

11. A method for manufacturing an electronic device, the method comprising:

mapping good elements and defective elements on a substrate;

providing a first transparent structure comprising a first adhesive layer on the substrate;

allowing the first adhesive layer to be in contact with the good elements and the defective elements;

selectively providing ultraviolet light to the defective elements to fix the defective elements to the first transparent structure by the first adhesive layer and separate the defective elements from the substrate;

providing a second transparent structure comprising a second adhesive layer, which adheres to new elements replaced for the defective elements, on the substrate; and allowing the new elements to be in contact with the substrate; and selectively providing ultraviolet light or infrared light to the new elements to bond the new elements to the substrate.

12. The method of claim 11, wherein the first adhesive layer comprises an ultraviolet curable adhesive, and the second adhesive layer comprises a thermoplastic resin.

13. The method of claim 11, wherein the first adhesive layer comprises:

a first lower adhesive layer on the first transparent structure; and a first upper adhesive layer on the first lower adhesive layer.

14. The method of claim 13, wherein the first lower adhesive layer comprises a thermosetting resin, and the first upper adhesive layer comprises a photo-curable resin.

15. The method of claim 13, wherein the first transparent structure comprises a first heater layer that heats the first lower adhesive layer.

16. The method of claim 11, wherein the second adhesive layer comprises:

a second lower adhesive layer on the second transparent structure; and a second upper adhesive layer on the second lower adhesive layer.

17. The method of claim 16, wherein the second lower adhesive layer comprises a thermoplastic resin, and the second upper adhesive layer comprises a photo plastic resin.

18. The method of claim 16, wherein the second transparent structure comprises a second heater layer that heats the second lower adhesive layer.

19. The method of claim 11, wherein each of the first and second transparent structures comprises glass, sapphire, acrylic, polyimide, epoxy, or quartz.

20. The method of claim 11, wherein each of the good elements and the defective elements comprises a light emitting diode.

* * * * *